United States Patent
Deweerd et al.

(10) Patent No.: US 8,647,960 B2
(45) Date of Patent: Feb. 11, 2014

(54) ANNEAL TO MINIMIZE LEAKAGE CURRENT IN DRAM CAPACITOR

(75) Inventors: Wim Deweerd, San Jose, CA (US); Hiroyuki Ode, Higashihiroshima (JP)

(73) Assignees: Intermolecular, Inc., San Jose, CA (US); Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/295,292

(22) Filed: Nov. 14, 2011

(65) Prior Publication Data
US 2013/0122682 A1     May 16, 2013

(51) Int. Cl.
*H01L 21/20*     (2006.01)

(52) U.S. Cl.
USPC .......................................... 438/396; 257/528

(58) Field of Classification Search
USPC ................... 438/381, 393, 396, 397; 257/528
See application file for complete search history.

(56) References Cited

U.S. PATENT DOCUMENTS

| | | | | |
|---|---|---|---|---|
| 6,136,641 | A * | 10/2000 | Won et al. | 438/240 |
| 6,207,528 | B1 * | 3/2001 | Lee | 438/398 |
| 2001/0054728 | A1 * | 12/2001 | Paz de Araujo et al. | 257/296 |
| 2002/0034857 | A1 * | 3/2002 | Park et al. | 438/396 |
| 2003/0062558 | A1 * | 4/2003 | Yang et al. | 257/296 |
| 2004/0033701 | A1 * | 2/2004 | Ahn et al. | 438/785 |
| 2004/0141390 | A1 * | 7/2004 | Won et al. | 365/200 |
| 2006/0097305 | A1 * | 5/2006 | Lee | 257/310 |
| 2007/0252928 | A1 * | 11/2007 | Ito et al. | 349/106 |
| 2008/0111173 | A1 * | 5/2008 | Wang | 257/295 |
| 2009/0297696 | A1 * | 12/2009 | Pore et al. | 427/79 |

* cited by examiner

*Primary Examiner* — William D Coleman
*Assistant Examiner* — John M Parker

(57) ABSTRACT

A method for forming a DRAM MIM capacitor stack comprises forming a first electrode layer, annealing the first electrode layer, forming a dielectric layer on the first electrode layer, annealing the dielectric layer, forming a second electrode layer on the dielectric layer, annealing the second electrode layer, patterning the capacitor stack, and annealing the capacitor stack for times greater than about 10 minutes, and advantageously greater than about 1 hour, at low temperatures (less than about 300 C) in an atmosphere containing less than about 25% oxygen and preferably less than about 10% oxygen.

16 Claims, 5 Drawing Sheets

ANNEAL TO MINIMIZE LEAKAGE CURRENT IN DRAM CAPACITOR

This document relates to the subject matter of a joint research agreement between Intermolecular, Inc. and Elpida Memory, Inc.

FIELD OF THE INVENTION

The present invention generally relates to the field of dynamic random access memory (DRAM), and more particularly to material processing for improved DRAM performance.

BACKGROUND OF THE INVENTION

Dynamic Random Access Memory utilizes capacitors to store bits of information within an integrated circuit. A capacitor is formed by placing a dielectric material between two electrodes formed from conductive materials. A capacitor's ability to hold electrical charge (i.e., capacitance) is a function of the surface area of the capacitor plates A, the distance between the capacitor plates d (i.e. the physical thickness of the dielectric layer), and the relative dielectric constant or k-value of the dielectric material. The capacitance is given by:

$$C = \kappa\varepsilon_o \frac{A}{d} \quad \text{(Eqn. 1)}$$

where $\varepsilon_0$ represents the vacuum permittivity.

The dielectric constant is a measure of a material's polarizability. Therefore, the higher the dielectric constant of a material, the more charge the capacitor can hold. Therefore, if the k-value of the dielectric is increased, the area of the capacitor can be decreased and maintain the desired cell capacitance. Reducing the size of capacitors within the device is important for the miniaturization of integrated circuits. This allows the packing of millions (mega-bit (Mb)) or billions (giga-bit (Gb)) of memory cells into a single semiconductor device. The goal is to maintain a large cell capacitance (generally ~10 to 25 fF) and a low leakage current (generally $<10^{-7}$ A cm$^{-2}$). The physical thickness of the dielectric layers in DRAM capacitors could not be reduced unlimitedly in order to avoid leakage current caused by tunneling mechanisms which exponentially increases as the thickness of the dielectric layer decreases.

Traditionally, SiO$_2$ has been used as the dielectric material and semiconducting materials (semiconductor-insulator-semiconductor [SIS] cell designs) have been used as the electrodes. The cell capacitance was maintained by increasing the area of the capacitor using very complex capacitor morphologies while also decreasing the thickness of the SiO$_2$ dielectric layer. Increases of the leakage current above the desired specifications have demanded the development of new capacitor geometries, new electrode materials, and new dielectric materials. Cell designs have migrated to metal-insulator-semiconductor (MIS) and now to metal-insulator-metal (MIM) cell designs for higher performance.

One class of high-k dielectric materials possessing the characteristics required for implementation in advanced DRAM capacitors are high-k metal oxide materials. Examples of suitable dielectric materials comprise SiO$_2$, a bilayer of SiO$_2$ and Si$_x$N$_y$, SiON, Al$_2$O$_3$, HfO$_2$, HfSiO$_x$, ZrO$_2$, Ta$_2$O$_5$, TiO$_2$, Nb$_2$O$_5$, SrTiO$_3$ (STO), BaSrTiO$_x$ (BST), PbZr-TiO$_x$ (PZT), etc. TiO$_2$ and ZrO$_2$ are two specific examples of metal oxide dielectric materials which display significant promise in terms of serving as a high-k dielectric material for implementation in DRAM capacitors.

Typically, DRAM devices at technology nodes of 80 nm and below use MIM capacitors wherein the electrode materials are metals. These electrode materials generally have higher conductivities than the semiconductor electrode materials, higher work functions, exhibit improved stability over the semiconductor electrode materials, and exhibit reduced depletion effects. The electrode materials must have high conductivity to ensure fast device speeds. Representative examples of electrode materials for MIM capacitors are metals, conductive metal oxides, conductive metal silicides, conductive metal nitrides (i.e. TiN), or combinations thereof. MIM capacitors in these DRAM applications utilize insulating materials having a dielectric constant, or k-value, significantly higher than that of SiO$_2$ (k=3.9). For DRAM capacitors, the goal is to utilize dielectric materials with k values greater than about 40. Such materials are generally classified as high-k materials. Representative examples of high-k materials for MIM capacitors are non-conducting metal oxides, non-conducting metal nitrides, non-conducting metal silicates or combinations thereof. These dielectrics may also include additional dopant materials.

A figure of merit in DRAM technology is the electrical performance of the dielectric material as compared to SiO$_2$ known as the Equivalent Oxide Thickness (EOT). A high-k material's EOT is calculated using a normalized measure of silicon dioxide (SiO$_2$ k=3.9) as a reference, given by:

$$EOT = \frac{3.9}{\kappa} \cdot d \quad \text{(Eqn. 2)}$$

where d represents the physical thickness of the capacitor dielectric.

As DRAM technologies scale below the 40 nm technology node, manufacturers must reduce the EOT of the high-k dielectric films in MIM capacitors in order to increase charge storage capacity. The goal is to utilize dielectric materials that exhibit an EOT of less than about 0.8 nm while maintaining a physical thickness of about 5-20 nm.

Generally, as the dielectric constant of a material increases, the band gap of the material decreases. For example. The rutile phase of TiO$_2$ has a k-value of about 80 and a band gap of about 3.0 eV while ZrO$_2$ in the tetragonal phase has a k-value of about 43 and a band gap of about 5.8 eV. The low band gap may lead to high leakage current in the device. As a result, without the utilization of countervailing measures, capacitor stacks implementing high-k dielectric materials may experience large leakage currents. High work function electrodes (e.g., electrodes having a work function of greater than 5.0 eV) may be utilized in order to counter the effects of implementing a reduced band gap high-k dielectric layer within the DRAM capacitor. Metals, such as platinum, gold, ruthenium, and ruthenium oxide are examples of high work function electrode materials suitable for inhibiting device leakage in a DRAM capacitor having a high-k dielectric layer. The noble metal systems, however, are prohibitively expensive when employed in a mass production context. Moreover, electrodes fabricated from noble metals often suffer from poor manufacturing qualities, such as surface roughness, poor adhesion, and form a contamination risk in the fab.

Leakage current in capacitor dielectric materials can be due to Schottky emission, Frenkel-Poole defects (e.g. oxygen vacancies ($V_{ox}$) or grain boundaries), or Fowler-Nordheim tunneling. Schottky emission, also called thermionic emission, is a common mechanism and is the thermally activated flow of charge over an energy barrier whereby the effective barrier height of a MIM capacitor controls leakage current. The nominal barrier height is a function of the difference between the work function of the electrode and the electron affinity of the dielectric. The electron affinity of a dielectric is closely related to the conduction band offset of the dielectric. The Schottky emission behavior of a dielectric layer is generally determined by the properties of the dielectric/electrode interface. Frenkel-Poole emission allows the conduction of charges through a dielectric layer through the interaction with defect sites such as vacancies, grain boundaries, and the like. As such, the Frenkel-Poole emission behavior of a dielectric layer is generally determined by the dielectric layer's bulk properties. Fowler-Nordheim emission allows the conduction of charges through a dielectric layer through direct tunneling without any intermediary interaction with e.g. defects. As such, the Fowler-Nordheim emission behavior of a dielectric layer is generally determined by the physical thickness of the dielectric layer. This leakage current is a primary driving force in the adoption of high-k dielectric materials. The use of high-k materials allows the physical thickness of the dielectric layer to be as thick as possible while maintaining the required capacitance (see Eqn 1 above).

Conductive metal oxides, conductive metal silicides, conductive metal nitrides, or combinations thereof comprise other classes of materials that may be suitable as DRAM capacitor electrodes. Generally, transition metals and their conductive binary compounds form good candidates as electrode materials. The transition metals exist in several oxidation states. Therefore, a wide variety of compounds are possible. Different compounds may have different crystal structures, electrical properties, etc. It is important to utilize the proper compound for the desired application.

The use of crystalline conductive metal oxides as a second electrode in MIM DRAM capacitors has been difficult due to a number of problems. After the formation of the second electrode, the capacitor stack is then subjected to a post metallization anneal (PMA) treatment. The PMA treatment serves to crystallize the second electrode and to anneal defects and interface states that are formed at the dielectric/second electrode interface during the deposition. Also, if there is no post dielectric anneal (PDA) treatment done before metallization, the PMA treatment can served to crystallize the dielectric layer. Examples of the PDA and PMA treatments are further described in U.S. application Ser. No. 13/159,842 filed on Jun. 14, 2011, entitled "METHOD OF PROCESSING MIM CAPACITORS TO REDUCE LEAKAGE CURRENT" and is incorporated herein by reference. Conductive metal oxides are sensitive to oxidation to oxygen-rich compounds that negatively impact their performance as an electrode material. Reducing atmosphere anneal processes are not an option at this stage of the device manufacture because they would degrade the performance of the dielectric layer through the formation of oxygen vacancies.

Additionally, DRAM capacitor stacks may undergo various refinement process steps after fabrication. These refinement processes may include post-fabrication chemical and thermal processing (i.e., oxidation or reduction). For instance, after initial DRAM capacitor stack fabrication, a number of high temperature (up to about 600 C) processes may be applied to complete the device fabrication. Typically, the second electrode layer as well as several of the other capacitor stack layers may be patterned using well known photolithography and etch steps. The purpose of this step is to generate the final 3-dimensional structure of the capacitor. However, it has been found that the patterning of the capacitor stack may damage the materials leading to high leakage current. Therefore, process steps must be developed to complete the integration of the capacitor stack into the final DRAM device manufacturing process sequence. The etch steps may be wet-chemical based or may be reactive ion-based. During these subsequent process steps, the DRAM electrode materials must remain chemically, physically, and structurally stable. They must maintain the structural, compositional, physical, and electrical properties that have been developed. Furthermore, they should not undergo significant interaction or reaction with the dielectric layer which may degrade the performance of the DRAM capacitor. Therefore, there is a need for methods that address the requirements listed above and allow the use of conductive metal oxide materials as a second electrode in the manufacture of DRAM MIM capacitors.

SUMMARY OF THE DISCLOSURE

In some embodiments of the present invention, a conductive metal oxide material is formed as a first electrode layer in the manufacture of DRAM MIM devices. The first electrode layer is annealed under conditions that crystallize the electrode but prevents the formation of oxygen-rich compounds. A doped high k dielectric material is formed on the first electrode layer and annealed to crystallize the dielectric material. A conductive metal oxide material is formed as a second electrode layer on the doped high k dielectric material. The second electrode layer is annealed under conditions that crystallize the electrode but prevents the formation of oxygen-rich compounds. The second electrode layer is patterned using well known photolithography and etch steps. The capacitor stack is then annealed at low temperatures (less than about 300 C) for times greater than about 10 minutes, and advantageously greater than about 1 hour. The remaining DRAM device manufacturing processes are executed.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Figure 1:
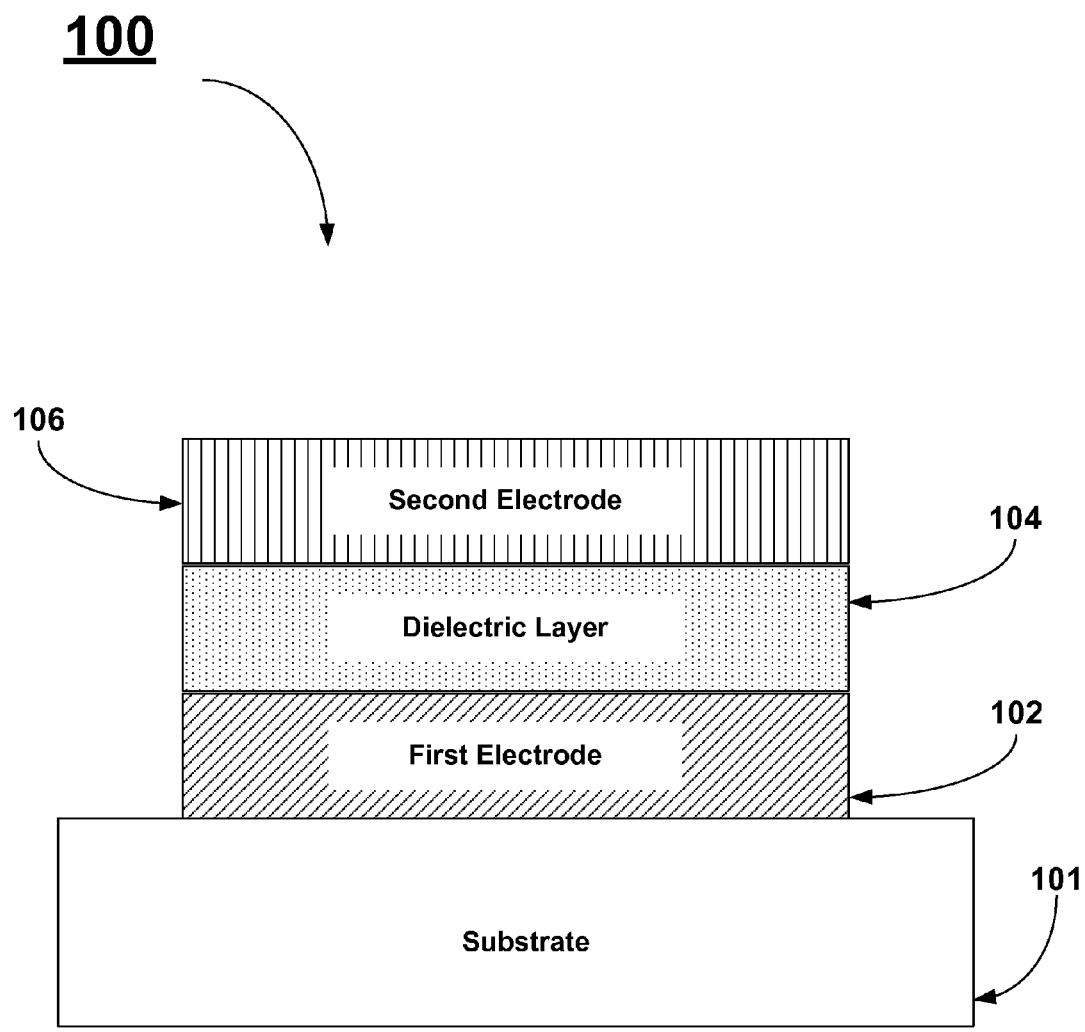
FIG. 1 illustrates a simplified cross-sectional view of a DRAM capacitor stack fabricated in accordance with some embodiments of the present invention.

FIG. 1 illustrates a simplified cross-sectional view of a DRAM capacitor stack fabricated in accordance with some embodiments of the present invention. First electrode layer, 102, is formed on substrate, 101. Generally, the substrate has already received several processing steps in the manufacture of a full DRAM device. First electrode layer, 102, comprises one of metals, metal alloys, conductive metal oxides, conductive metal nitrides, conductive metal silicides, or combination thereof. First electrode, 102, can be annealed to crystallize the material.

In the next step, dielectric layer, 104, would then be formed on the annealed first electrode layer, 102. A wide variety of dielectric materials have been targeted for use in DRAM capacitors. Examples of suitable dielectric materials comprise $SiO_2$, a bilayer of $SiO_2$ and $Si_xN_y$, SiON, $Al_2O_3$, $HfO_2$, $HfSiO_x$, $ZrO_2$, $Ta_2O_5$, $TiO_2$, $Nb_2O_5$, $SrTiO_3$ (STO), $SrBaTiO_x$ (SBT), $PbZrTiO_x$ (PZT), or doped versions of the same. These dielectric materials may be formed as a single layer or may be formed as a hybrid or nanolaminate structure. The dielectric materials are typically doped to further reduce the leakage current. Typically, dielectric layer, 104, is subjected to a PDA treatment before the formation of the second electrode.

In the next step, the second electrode layer, 106, is formed on dielectric layer, 104 to complete the formation of the capacitor stack. The second electrode layer may be one of metals, metal alloys, conductive metal oxides, conductive metal nitrides, conductive metal silicides, or combination thereof. Typically, the capacitor stack is subjected to a PMA treatment after the formation of the second electrode.

Those skilled in the art will appreciate that each of the first electrode layer, the dielectric layer, and the second electrode layer used in the MIM DRAM capacitor may be formed using any common formation technique such as atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), or physical vapor deposition (PVD). Generally, because of the complex morphology of the DRAM capacitor structure, ALD, PE-ALD, AVD, or CVD are preferred methods of formation. However, any of these techniques are suitable for forming each of the various layers discussed below. Those skilled in the art will appreciate that the teachings described below are not limited by the technology used for the deposition process.

Figure 5:
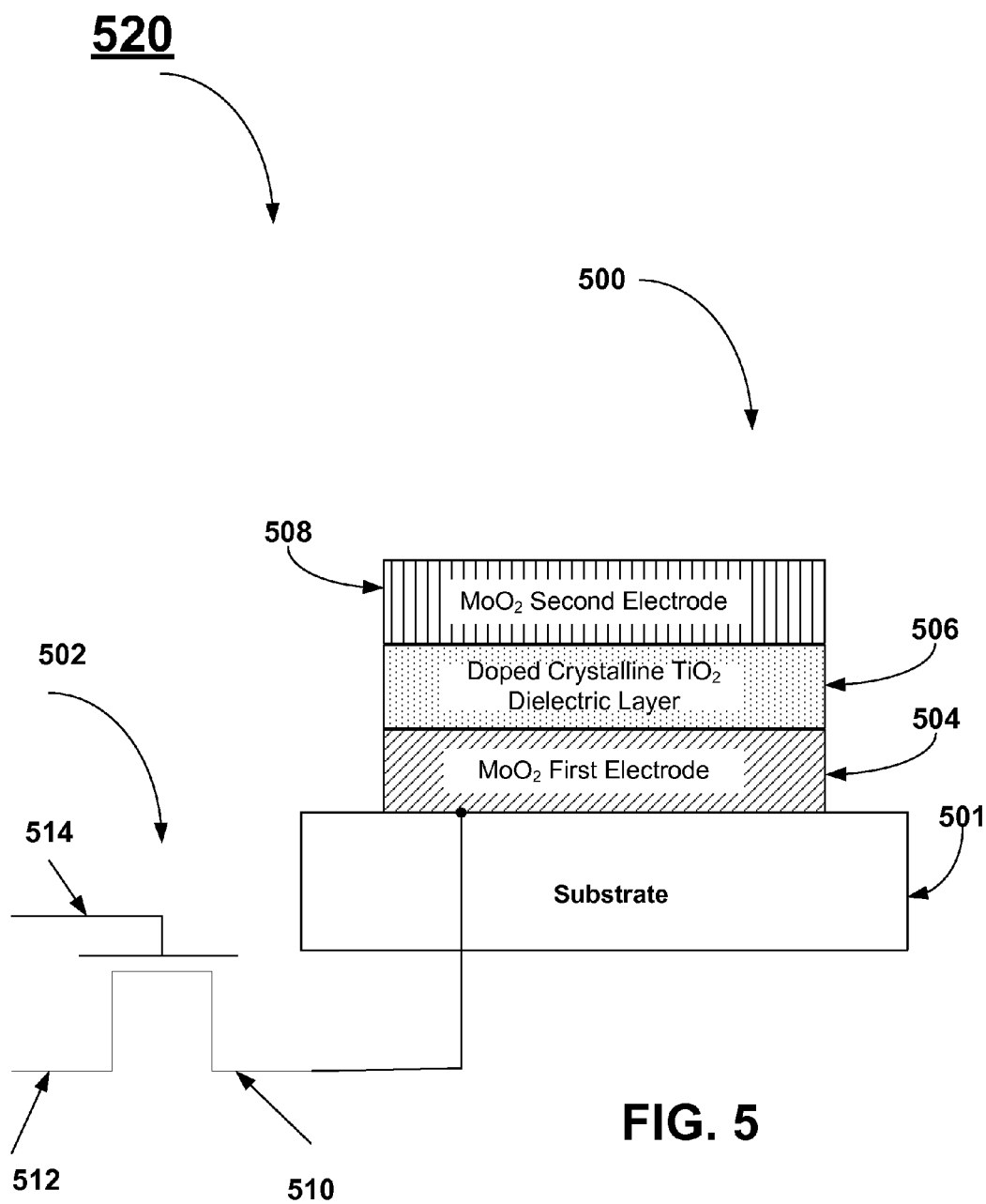
FIG. 5 illustrates a simplified cross-sectional view of a DRAM memory cell fabricated in accordance with some embodiments of the present invention.

In FIGS. 1, and 5, a capacitor stack is illustrated using a simple planar structure. Those skilled in the art will appreciate that the description and teachings to follow can be readily applied to any simple or complex capacitor morphology. The drawings are for illustrative purposes only and do not limit the application of the present invention.

Figure 2:
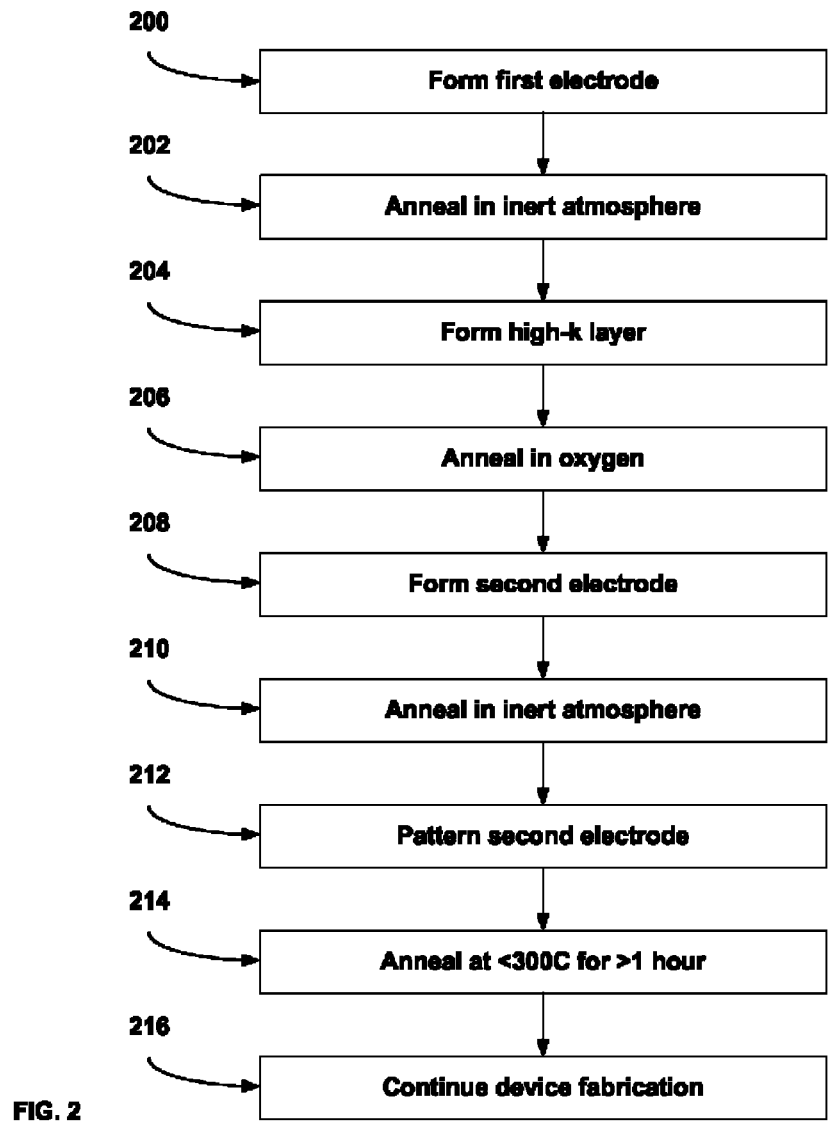
FIG. 2 illustrates a flow chart illustrating a method for fabricating a DRAM capacitor stack in accordance with some embodiments of the present invention.

FIG. 2 illustrates a flow chart illustrating a method for fabricating a DRAM capacitor stack in accordance with some embodiments of the present invention. In step 200, a first electrode layer is formed on a substrate. Generally, the substrate has already received several processing steps in the manufacture of a full DRAM device. The first electrode layer comprises one of metals, metal alloys, conductive metal oxides, conductive metal nitrides, conductive metal silicides, or combination thereof. A class of materials that is specifically interesting is the conductive metal oxides. Examples of such conductive metal oxides include the conductive compounds of molybdenum oxide, tungsten oxide, ruthenium oxide, iron oxide, iridium oxide, chromium oxide, manganese oxide, tin oxide, cobalt oxide, or nickel oxide.

In step 202, the first electrode layer is annealed to crystallize the layer. In one example where the first electrode layer is a metal oxide, the first electrode layer, 202, is annealed in a reducing atmosphere to reduce the concentration of the oxygen-rich components. Generally, the reducing atmosphere will comprise $H_2$, or $NH_3$ mixed with an inert gas such as $N_2$ or Ar. Forming gas is a specific example of a reducing atmosphere and is available commercially wherein the $H_2$ concentration can range between about 1 and 25% mixed with $N_2$. One example of such an annealing process is further described in U.S. application Ser. No. 13/084,666 filed on Apr. 12, 2011, referenced earlier. Alternatively, the first electrode layer may be annealed using a Rapid Thermal Anneal (RTA) technique wherein the temperature is quickly raised in the presence of a nitrogen containing gas such as $N_2$, forming gas, $NH_3$, etc. Examples of such electrode treatment steps are further described in U.S. application Ser. No. 13/051,531 filed on Mar. 18, 2011, which is incorporated herein by reference. Optionally, the first electrode layer may receive an etch step prior to the anneal treatment to improve the performance of the first electrode layer as described in U.S. application Ser. No. 13/234,381 filed on Sep. 16, 2011, entitled "PARTIAL ETCH OF DRAM ELECTRODE" and is incorporated herein by reference.

In the next step 204, a dielectric layer would then be formed on the first electrode layer. A wide variety of dielectric materials have been targeted for use in DRAM capacitors. Examples of suitable dielectric materials comprise $SiO_2$, bilayer of $SiO_2$ and $Si_xN_y$, SiON, $Al_2O_3$, $HfO_2$, $HfSiO_x$, $ZrO_2$, $Ta_2O_5$, $TiO_2$, $Nb_2O_5$, $SrTiO_3$ (STO), $SrBaTiO_x$ (SBT), $PbZrTiO_x$ (PZT) or doped versions of the same such as $Al:TiO_2$. These dielectric materials may be formed as a single layer or may be formed as a hybrid or nanolaminate structure. Specific dielectric materials of interest are the rutile-phase of $TiO_2$ and the tetragonal or cubic phases of $ZrO_2$. A specific dielectric material of interest is $TiO_2$ doped with one of Al, Zr, Ge, Hf, Sn, Sr, Y, Si, La, Er, Ga, Gd, Mg, Co, or combinations thereof.

In the next step, 206, the dielectric layer can then be subjected to a post dielectric anneal (PDA) treatment. The PDA treatment generally occurs in an oxygen containing atmosphere. The PDA step serves to crystallize the dielectric layer and fill oxygen vacancies.

The next step, 208, comprises forming a second electrode on the dielectric layer. Examples of suitable second electrode materials comprise metals, metal alloys, conductive metal oxides, conductive metal silicides, conductive metal nitrides, and combinations thereof. A particularly interesting class of materials is the conductive metal oxides. Examples of such conductive metal oxides include the conductive compounds of molybdenum oxide, tungsten oxide, ruthenium oxide, iron oxide, iridium oxide, chromium oxide, manganese oxide, tin oxide, cobalt oxide, or nickel oxide.

In the next step 210, the capacitor stack would then be annealed using a post metallization anneal (PMA) treatment. Examples of the PDA and PMA treatments are further described in U.S. application Ser. No. 13/159,842 referenced earlier. Optionally, the second electrode layer may receive an etch step prior to the PMA treatment to improve the performance of the second electrode layer as discussed earlier.

In the next step 212, at least a portion of the capacitor stack (i.e. the second electrode layer as well as several of the other capacitor stack layers) may be patterned using well known photolithography and etch steps. The purpose of this step is to generate the final 3-dimensional structure of the capacitor. However, it has been found that the patterning of the capacitor stack may damage the materials leading to high leakage current. Therefore, process steps must be developed to complete the integration of the capacitor stack into the final DRAM device manufacturing process sequence.

In step 214, the patterned capacitor stack is subjected to an anneal for times greater than about 10 minutes, and advantageously greater than about 1 hour, at low temperatures (less than about 300 C). Preferably, the anneal occurs in an atmosphere of a dilute oxidizing species, preferably less than about 25% oxidizing species, and more preferably less than about 10% oxidizing species. Examples of suitable oxidizing species include $O_2$, $O_3$, $N_2O$, etc. This anneal step serves to repair the damage in the capacitor stack induced by the patterning and etch steps and lowers the leakage current. Advantageously, the anneal treatment occurs in a timely manner after the patterning of the capacitor stack.

In step 216, the remaining portions of the DRAM device manufacturing process sequence are completed.

Figure 3:
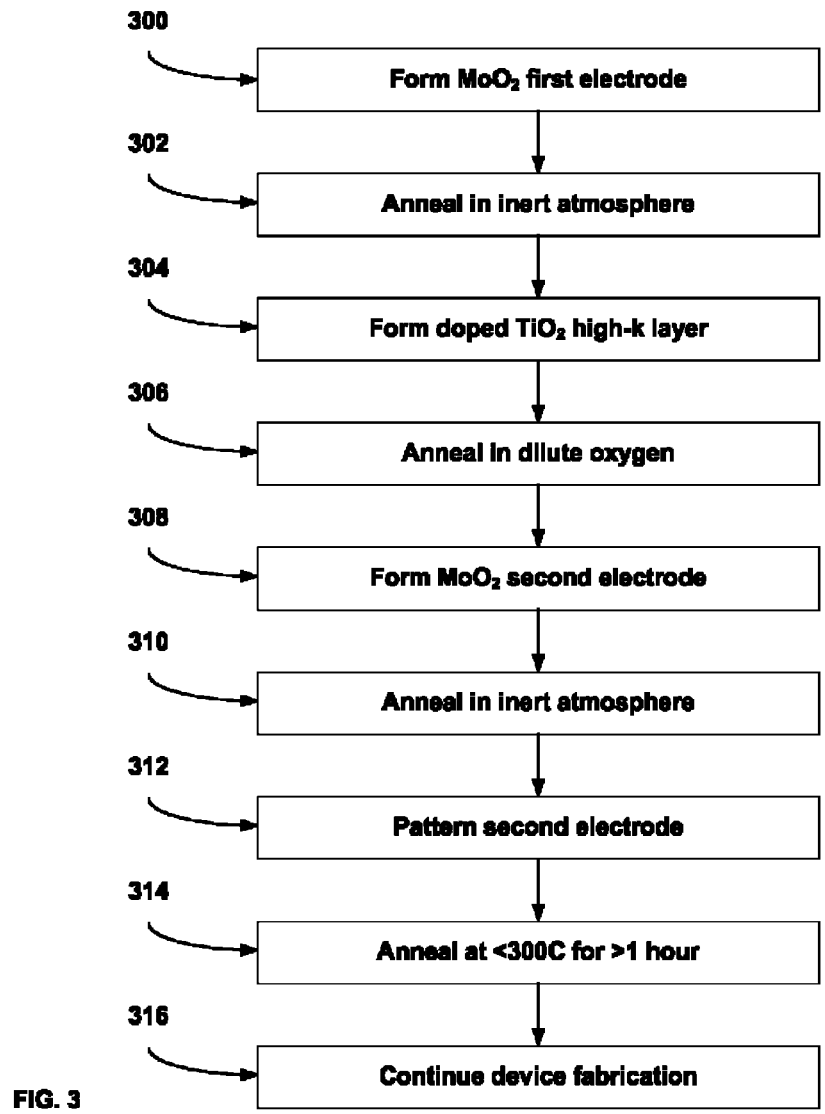
FIG. 3 illustrates a flow chart illustrating a method for fabricating a DRAM capacitor stack in accordance with some embodiments of the present invention.

FIG. 3 illustrates a flow chart illustrating a method for fabricating a DRAM capacitor stack in accordance with some embodiments of the present invention. In step 300, a first electrode layer is formed on a substrate. Generally, the substrate has already received several processing steps in the manufacture of a full DRAM device. The first electrode layer comprises one of metals, metal alloys, conductive metal oxides, conductive metal nitrides, conductive metal silicides, etc. For this example, the first electrode layer comprises a conductive metal oxide that may serve to promote the rutile phase of $TiO_2$. Examples of such conductive metal oxides include the conductive compounds of molybdenum oxide, tungsten oxide, ruthenium oxide, iron oxide, iridium oxide, chromium oxide, manganese oxide, tin oxide, cobalt oxide, or nickel oxide. A specific electrode material of interest is the crystalline $MoO_2$ compound of molybdenum dioxide.

In step 302, the first electrode layer can be annealed to crystallize the material. In the case of crystalline $MoO_2$, it is advantageous to anneal the first electrode in a reducing atmosphere to prevent the formation of oxygen-rich compounds as discussed earlier. Optionally, the first electrode layer may receive an etch step prior to the anneal treatment to improve the performance of the first electrode layer as discussed earlier.

In one example of the present invention, a first electrode layer comprising between about 5 nm and about 10 nm of molybdenum oxide is formed on a substrate. The molybdenum oxide electrode material is formed at a process temperature between about 125 C and 400 C using an ALD process technology. The substrate with the first electrode is then annealed in a reducing atmosphere comprising between about 1% and about 20% $H_2$ in $N_2$ and advantageously between about 5% and about 10% $H_2$ in $N_2$ between 400 and 520 C for between about 1 millisecond and about 60 minutes.

In the next step 304, a dielectric layer would then be formed on the annealed first electrode layer. A wide variety of dielectric materials have been targeted for use in DRAM capacitors. Examples of suitable dielectric materials comprise $SiO_2$, a bilayer of $SiO_2$ and $Si_xN_y$, SiON, $Al_2O_3$, $HfO_2$, $HfSiO_x$, $ZrO_2$, $Ta_2O_5$, $TiO_2$, $Nb_2O_5$, $SrTiO_3$ (STO), $SrBaTiO_x$ (SBT), PbZr$TiO_x$ (PZT), or doped versions of the same. These dielectric materials may be formed as a single layer or may be formed as a hybrid or nanolaminate structure. Typically, the dielectric layer is subjected to a PDA treatment in step 306 before the formation of the second electrode as discussed previously. A specific dielectric material of interest is $TiO_2$ doped with one of Al, Zr, Ge, Hf, Sn, Sr, Y, Si, La, Er, Ga, Gd, Mg, Co, or combinations thereof. A specific dielectric material of interest is $TiO_2$ doped with $Al_2O_3$ to between about 5 atomic % and about 15 atomic % Al (i.e. Al/(Ti+Al)).

In a specific example, the dielectric layer comprises between about 6 nm to about 10 nm of $TiO_2$ wherein at least 30% of the $TiO_2$ is present in the rutile phase. Generally, the $TiO_2$ dielectric layer may either be a single film or may comprise a nanolaminate. Advantageously, the $TiO_2$ material is doped with Al at a concentration between about 5 atomic % and about 15 atomic % Al. The $TiO_2$ dielectric layer is formed at a process temperature between about 200 C and 350 C using an ALD process technology. The substrate with the first electrode and dielectric layer is then annealed in an oxidizing atmosphere comprising between about 0% $O_2$ to about 100% $O_2$ in $N_2$ and advantageously between about 0% $O_2$ to about 20% $O_2$ in $N_2$ at temperatures between about 400 C to about 600 C for between about 1 millisecond to about 60 minutes.

In step 308, a second electrode layer is formed on the dielectric layer. The second electrode layer comprises one of metals, metal alloys, conductive metal oxides, conductive metal nitrides, conductive metal silicides, etc. For this example, the second electrode layer comprises a conductive metal oxide. Examples of such conductive metal oxides include the conductive compounds of molybdenum oxide, tungsten oxide, ruthenium oxide, iron oxide, iridium oxide, chromium oxide, manganese oxide, tin oxide, cobalt oxide, or nickel oxide. A specific electrode material of interest is the crystalline $MoO_2$ compound of molybdenum dioxide.

In step 310, the second electrode layer can be annealed to crystallize the material. In the case of crystalline $MoO_2$, it is advantageous to anneal the second electrode in an inert atmosphere as part of a PMA treatment to prevent the formation of oxygen-rich compounds in the $MoO_2$ as discussed earlier. Optionally, the second electrode layer may receive an etch step prior to the PMA treatment to improve the performance of the second electrode layer as discussed earlier.

In one example of the present invention, a second electrode layer comprising between about 5 nm and about 10 nm of molybdenum oxide is formed on the dielectric layer. The molybdenum oxide electrode material is formed at a process temperature between about 125 C and 400 C using an ALD process technology. The capacitor stack with the second electrode is then annealed in an inert atmosphere of $N_2$ or Ar at a temperature between about 400 and about 520 C for between about 1 millisecond and about 60 minutes.

In the next step 312, at least a portion of the capacitor stack (i.e. the second electrode layer as well as several of the other capacitor stack layers) may be patterned using well known photolithography and etch steps. The purpose of this step is to generate the final 3-dimensional structure of the capacitor. However, it has been found that the patterning of the capacitor stack may damage the materials leading to high leakage current. Therefore, process steps must be developed to complete the integration of the capacitor stack into the final DRAM device manufacturing process sequence.

In step 314, the patterned capacitor stack is subjected to an anneal for times greater than about 10 minutes, and advantageously greater than about 1 hour, at low temperatures (less than about 300 C). Preferably, the anneal occurs in an atmosphere of a dilute oxidizing species, preferably less than about 25% oxidizing species, and more preferably less than about 10% oxidizing species. Examples of suitable oxidizing species include $O_2$, $O_3$, $N_2O$, etc. This anneal step serves to repair the damage in the capacitor stack induced by the patterning and etch steps and lowers the leakage current. Advantageously, the anneal treatment occurs in a timely manner after the patterning of the capacitor stack In step 316, the remaining portions of the DRAM device manufacturing process sequence are completed.

Figure 4:
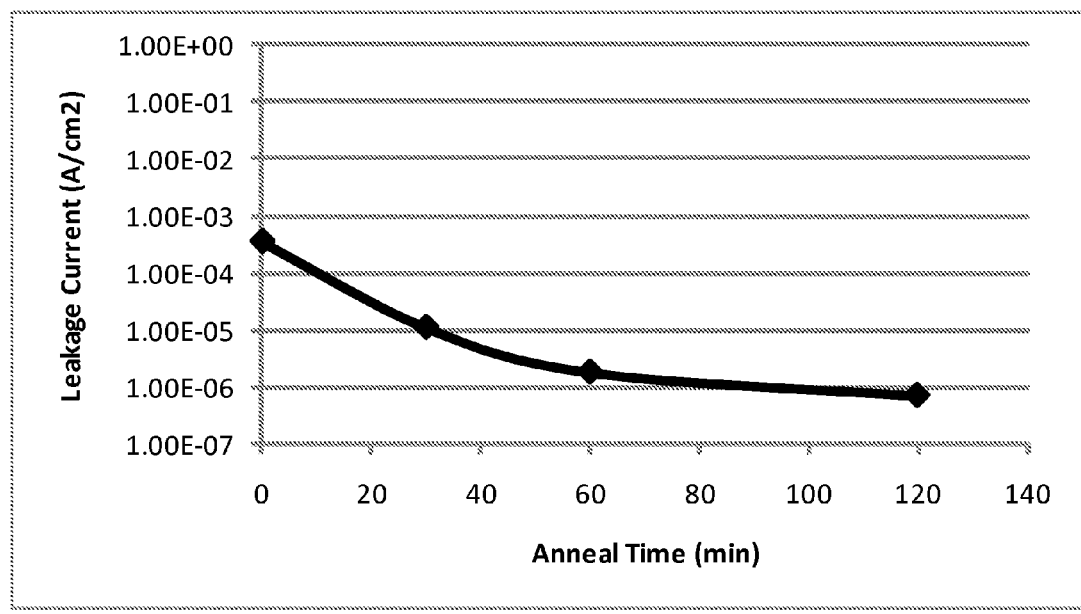
FIG. 4 presents data illustrating the change in leakage current as a function of anneal time.

FIG. 4 presents data illustrating the change in leakage current as a function of anneal time. The capacitor stack consisted of a $MoO_2$ first electrode layer, an Al doped $TiO_2$ dielectric layer, and a $MoO_2$ second electrode layer as discussed previously. After the etch portion of the patterning step, the leakage current was measured to be about $3.5 \times 10^{-4}$ $A/cm^2$. The capacitor stack was annealed at about 300 C for about 30 minutes in an atmosphere containing less than about 10% oxygen. After this anneal treatment, the measured leakage current decreased to about $1.1 \times 10^{-6}$ $A/cm^2$. The capacitor stack was annealed at about 300 C for an additional about 30 minutes (about 60 minutes total) in an atmosphere containing less than about 10% oxygen. After this anneal treatment, the measured leakage current further decreased to about $1.8 \times 10^{-6}$ $A/cm^2$. The capacitor stack was annealed at about 300 C for an additional about 60 minutes (about 120 minutes total) in an atmosphere containing less than about 10% oxygen. After this anneal treatment, the measured leakage current further decreased to about $7.0 \times 10^{-7}$ $A/cm^2$. Clearly, the long anneal treatment at low temperature resulted in the benefit of lower leakage current.

An example of a specific application of some embodiments of the present invention is in the fabrication of capacitors used in the memory cells in DRAM devices. DRAM memory cells effectively use a capacitor to store charge for a period of time, with the charge being electronically "read" to determine whether a logical "one" or "zero" has been stored in the associated cell. Conventionally, a cell transistor is used to access the cell. The cell transistor is turned "on" in order to store data on each associated capacitor and is otherwise turned "off" to isolate the capacitor and preserve its charge. More complex DRAM cell structures exist, but this basic DRAM structure will be used for illustrating the application of this disclosure to capacitor manufacturing and to DRAM manufacturing. FIG. 5 is used to illustrate one DRAM cell, 520, manufactured using a metal oxide first electrode layer, a dielectric layer, and a metal oxide second electrode layer structure as discussed previously. The cell, 520, is illustrated schematically to include two principle components, a cell capacitor, 500, and a cell transistor, 502. The cell transistor is usually constituted by a MOS transistor having a gate, 514, source, 510, and drain, 512. The gate is usually connected to a word line and one of the source or drain is connected to a bit line. The cell capacitor has a lower or storage electrode and an upper or plate electrode. The storage electrode is connected to the other of the source or drain and the plate electrode is connected to a reference potential conductor. The cell transistor is, when selected, turned "on" by an active level of the word line to read or write data from or into the cell capacitor via the bit line.

As was described previously in connection with FIG. 1 and the methods described in FIG. 2 and FIG. 3, the cell capacitor, 500, comprises a first electrode, 504, formed on substrate, 501. The first electrode, 504, is connected to the source or drain of the cell transistor, 502. For illustrative purposes, the first electrode has been connected to the source, 510, in this example. For the purposes of illustration, first electrode, 504, will be crystalline $MoO_2$ as described previously. As discussed previously, first electrode, 504, may be subjected to an anneal in a reducing atmosphere before the formation of the dielectric layer to crystallize the $MoO_2$ and to reduce any $MoO_{2+x}$ compounds that may have formed during the formation of the first electrode. Dielectric layer, 506, is formed on top of the first electrode. For the purposes of illustration, dielectric layer, 506, will be rutile-phase $TiO_2$. As discussed previously, the $TiO_2$ may be doped. A specific dielectric material of interest is $TiO_2$ doped with one of Al, Zr, Ge, Hf, Sn, Sr, Y, Si, La, Er, Ga, Gd, Mg, Co, or combinations thereof. Typically, the dielectric layer is then subjected to a PDA treatment. The second electrode layer, 508, is then formed on top of the dielectric layer. For the purposes of illustration, the second electrode layer, 508, will be $MoO_2$ in this example. The capacitor stack is then subjected to a PMA treatment. The capacitor stack is then patterned using well known photolithography and etch steps. The capacitor stack is then annealed for times greater than about 10 minutes, and advantageously greater than about 1 hour, at low temperatures (less than about 300 C) in an atmosphere containing less than about 25% oxidizing species and preferably less than about 10% oxidizing species. Examples of suitable oxidizing species include $O_2$, $O_3$, $N_2O$, etc. This completes the formation of the capacitor stack and the remaining portions of the DRAM device can be manufactured.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming a capacitor stack, the method comprising:
    forming a first electrode layer on a substrate,
        wherein the first electrode layer comprises a conductive metal oxide;
    annealing the first electrode layer in a reducing atmosphere;
    after annealing the first electrode layer, forming a dielectric layer on the first electrode layer,
        the dielectric layer comprising titanium oxide doped with aluminum;
    forming a second electrode layer on the dielectric layer,
        wherein the second electrode layer comprises a conductive metal oxide;
    annealing the second electrode layer in a temperature range between about 400 C and about 520 C for between about 1 millisecond and about 60 minutes;
    patterning at least a portion of the capacitor stack; and
    annealing the patterned capacitor stack at a temperature below about 300 C and for durations greater than about 10 minutes.

2. The method of claim 1 wherein the annealing of the patterned capacitor stack occurs for durations greater than about 1 hour.

3. The method of claim 2 wherein the annealing of the patterned capacitor stack occurs in an atmosphere containing less than about 10% of an oxidizing species.

4. The method of claim 1 wherein the annealing of the patterned capacitor stack occurs in an atmosphere containing less than about 25% of an oxidizing species.

5. The method of claim 1 wherein the conductive metal oxide of the first electrode layer comprises at least one of the conductive compounds of molybdenum oxide, tungsten oxide, ruthenium oxide, iron oxide, iridium oxide, chromium oxide, manganese oxide, tin oxide, cobalt oxide, or nickel oxide.

6. The method of claim 5 wherein the conductive metal oxide of the first electrode layer comprises molybdenum oxide.

7. The method of claim 1 wherein the conductive metal oxide of the second electrode layer comprises at least one of the conductive compounds of molybdenum oxide, tungsten oxide, ruthenium oxide, iron oxide, iridium oxide, chromium oxide, manganese oxide, tin oxide, cobalt oxide, or nickel oxide.

8. The method of claim 7 wherein the conductive metal oxide of the second electrode layer comprises molybdenum oxide.

9. The method of claim 1, wherein the annealing of the first electrode layer occurs in a temperature range between about 400 C and about 520 C.

10. The method of claim 1, wherein the annealing of the first electrode layer has a duration of between about 1 millisecond and about 60 minutes.

11. The method of claim 1 wherein the dielectric layer is further annealed at a temperature between about 400 C and about 600 C.

12. The method of claim 11 wherein the annealing of the dielectric layer occurs between 1 millisecond and 60 minutes.

13. The method of claim 1 wherein the conductive metal oxide of the first electrode layer comprises conductive molybdenum oxide, and wherein the conductive metal oxide of the second electrode layer comprises conductive molybdenum oxide.

14. The method of claim 1 wherein the patterning at least the portion of the capacitor stack comprises patterning the second electrode layer.

15. The method of claim 1, wherein at least 30% of titanium oxide of the dielectric layer is in a rutile phase.

16. The method of claim 1, wherein a concentration of aluminum in the dielectric layer is between about 5 atomic % and 15 atomic %.

* * * * *